United States Patent
Mun (10) Patent No.: US 11,289,530 B2
(45) Date of Patent: Mar. 29, 2022

(54) SHALLOW TRENCH ISOLATION (STI) STRUCTURE FOR CMOS IMAGE SENSOR

(71) Applicant: OmniVision Technologies, Inc., Santa Clara, CA (US)

(72) Inventor: Seong Yeol Mun, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 100 days.

(21) Appl. No.: 16/748,657

(22) Filed: Jan. 21, 2020

(65) Prior Publication Data

US 2021/0225924 A1 Jul. 22, 2021

(51) Int. Cl.
*H01L 31/113* (2006.01)
*H01L 27/146* (2006.01)

(52) U.S. Cl.
CPC .... *H01L 27/14645* (2013.01); *H01L 27/1463* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 6,114,741 A | 9/2000 | Joyner et al. | |
| 7,429,496 B2 | 9/2008 | Yaung | |
| 7,723,206 B2 | 5/2010 | Miyachi et al. | |
| 7,893,469 B2 | 2/2011 | Lee | |
| 8,173,502 B2 | 5/2012 | Yan et al. | |
| 8,415,189 B2 * | 4/2013 | Kwon | H01L 27/14603 438/48 |
| 10,170,517 B2 * | 1/2019 | Lee | H01L 27/14643 |
| 2002/0106864 A1 | 8/2002 | Chen et al. | |
| 2004/0004264 A1 | 1/2004 | Son et al. | |
| 2004/0089914 A1 * | 5/2004 | Mouli | H01L 21/02639 257/510 |
| 2004/0164373 A1 | 8/2004 | Koester et al. | |
| 2005/0253214 A1 | 11/2005 | Nagasaki et al. | |
| 2006/0049437 A1 * | 3/2006 | Hwang | H01L 27/14689 257/292 |

(Continued)

FOREIGN PATENT DOCUMENTS

| | | |
|---|---|---|
| TW | 201830681 A | 8/2018 |
| TW | 201913991 A | 4/2019 |
| WO | WO 2004044989 A1 | 5/2004 |

OTHER PUBLICATIONS

Taiwanese Patent Application No. 109133369 Office Action dated Apr. 23, 2021, with English translation, 17 pages.

(Continued)

*Primary Examiner* — Ali Naraghi
(74) *Attorney, Agent, or Firm* — Lathrop GPM LLP (57) ABSTRACT

A shallow trench isolation (STI) structure and method of fabrication includes a two-step epitaxial growth process. A trench larger than the target STI structure is etched into a semiconductor substrate, a first layer of un-doped semiconductor material epitaxially grown in the trench to provide an STI structure having a target depth and a critical dimension, and a second layer of doped semiconductor material epitaxially grown on the first layer, said second layer filling the trench and forming a protrusion above the front-side of the semiconductor substrate.

19 Claims, 8 Drawing Sheets

(56) References Cited

U.S. PATENT DOCUMENTS

2006/0138470 A1* 6/2006 Han ................. H01L 27/14689
                                                                                             257/233
2014/0084418 A1    3/2014 Ervin et al.
2017/0338327 A1* 11/2017 Liu ................... H01L 29/66795

OTHER PUBLICATIONS

Taiwanese Patent Application No. 109133368 Office Action dated May 25, 2021, with English translation, 22 pages.
U.S. Appl. No. 16/748,604 Non-Final Office Action dated Jul. 27, 2021, 12 pages.

* cited by examiner

SHALLOW TRENCH ISOLATION (STI) STRUCTURE FOR CMOS IMAGE SENSOR

BACKGROUND

Figure 1:
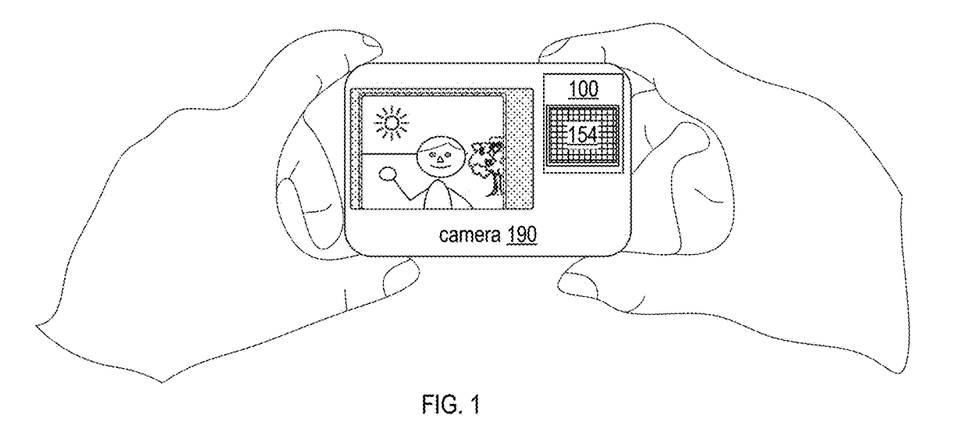
FIG. 1 depicts a camera that includes an image sensor, in an embodiment.

Wafer-level manufacturing using complementary metal-oxide semiconductor (CMOS) technology has enabled the incorporation of camera modules in many applications including automotive, security and mobile devices. For example, FIG. 1 depicts a camera 190 imaging a scene. Camera 190 includes an image-sensor 100, which includes a pixel array 154. In an embodiment, pixel array 154 is an array of individual pixels formed in a semiconductor wafer substrate such as silicon. Similar cameras used in automotive applications include, for example, a back-up camera, as well as front and side cameras.

There is a continuous demand for greater resolution in image sensors, preferably achieved by increasing the number of pixels on a wafer while maintaining the overall image sensor at the same dimension or even smaller. The more pixels in the image sensor, the greater the resolution of an image captured by the image sensor. This can be accomplished both by reducing pixel size so that more pixels may be placed on the wafer or by reducing the space between pixels.

Each pixel in an image sensor includes several devices including, for example, a photodiode and a plurality of transistors. For effective functioning, devices in an image sensor must be electrically isolated from each other. However, as pixel size becomes smaller, device isolation becomes more difficult, particularly with respect to current leakage between devices. Shallow trench isolation (STI) is a semiconductor processing technique of etching trenches in the wafer substrate to isolate pixels and individual devices within pixels, however, this technique often leads to trap-assisted-tunneling and increased dark current, especially when used in high temperature environments such as those frequently found in automotive applications.

Figure 2A:
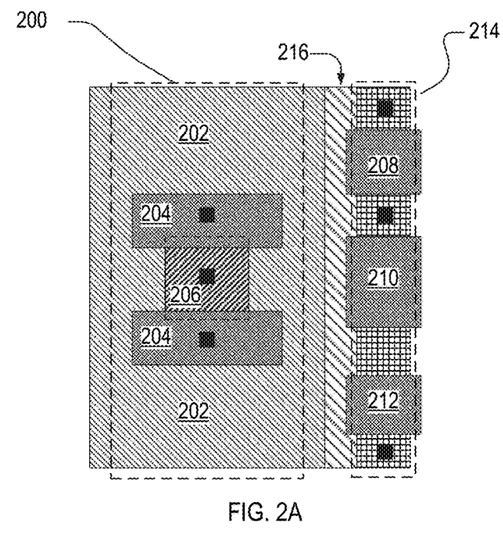
FIG. 2A is a schematic plan view of a pixel layout for an image sensor using shallow trench isolation.
Figure 2B:
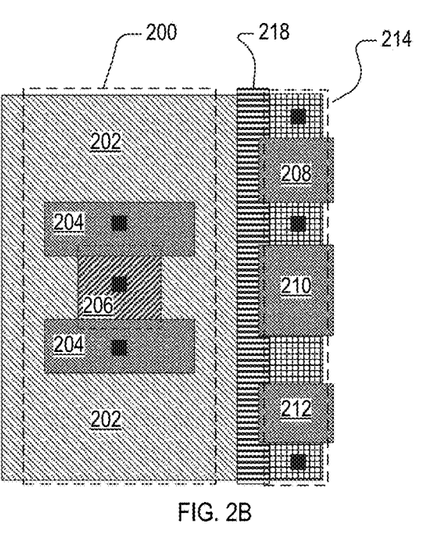
FIG. 2B is a schematic plan view of a pixel layout for an image sensor using implant isolation.

FIGS. 2A and 2B show an image sensor formed in a semiconductor substrate in a plan view. A photodiode 202, transfer transistors 204 and a floating diffusion node 206 are formed in a photodiode region 200 of the substrate having a first conductive type, e.g. N-type. Reset transistor 208, source-follower transistor 210 and row select transistor 212 are formed in a pixel transistor region 214 of the substrate having a second conductive type opposite to the first conductive type, e.g. P-type. Photodiode 202 in photodiode region 200 and transistors in pixel transistor region 214 must be electrically isolated from each other.

FIG. 2A depicts a pixel with a shallow trench isolation structure 216 between photodiode region 200 and pixel transistor region 214. Shallow trench isolation (STI) is a semiconductor processing technique of etching trenches in a wafer substrate and filling them with a dielectric to isolate pixels and individual devices within pixels. Silicon dangling bonds on the walls and bottom of STI structure 216 resulting from etching can contribute to increased dark current. Dangling bonds or broken bonds formed along the trench sidewall or between a silicon dioxide and silicon interface form trap sites. These trap sites may trap electrons or holes during operation, thus generating current inside or near the photodiode region of individual pixels and contributing to dark current or electrical current generated in photodiode region in absence of incident light. One method used to address this problem is a surface treatment process of thermal annealing and liner oxidation that grows a thin oxide layer on STI structure sidewalls, however this method still leaves enough Si dangling bonds to cause dark current. Another method is boron implantation to passivate the STI-Si-interface, however, boron diffuses into the silicon surrounding the trench and thus impacts the full well capacity of photodiode by reducing photodiode area. Thus, these processes do not completely resolve silicon dangling bonds.

The problem of dangling bonds may be avoided by using a boron implant area to isolate devices. FIG. 2B depicts the pixel of FIG. 2A with a boron implant area 218 separating photodiode region 200 from pixel transistor region 214 instead of an STI structure. However, using boron ion-implantation to isolate devices in a pixel also creates issues. These include high lateral diffusion of boron atoms into areas of the substrate adjacent to the boron ion-implantation. This lowers the full well capacity (FWC), or dynamic range, in photodiode areas. It also degrades the isolation resolution and causes high junction leakage by an abrupt Boron to N+ junction.

SUMMARY OF THE EMBODIMENTS

In a first aspect, a CMOS image sensor includes a semiconductor substrate having a photodiode region and a pixel transistor region separated by a shallow trench isolation (STI) structure, the substrate having a front-side surface forming a trench extending into the semiconductor substrate and having a trench depth D relative to a planar region of the front-side surface and a trench width W at the front-side surface of the substrate. The STI structure of the CMOS image sensor includes a first layer of un-doped semiconductor material epitaxially grown in the trench and a second layer of doped semiconductor material epitaxially grown on the first layer, the second layer filling the trench and forming a protrusion above the front-side of the semiconductor substrate and a gate oxide layer and a gate electrode of the pixel transistor formed on the front-side surface second layer.

In a second aspect, a method of forming a target shallow trench isolation (STI) structure in a semiconductor substrate of an image sensor includes patterning and etching a trench having a bottom and sidewalls in the semiconductor substrate, said trench having a depth (D) deeper than a target depth (TD) of the target STI structure relative to a planar region of a front-side surface of the semiconductor surface and a width (W) wider than a critical dimension (CD) of the target STI structure at the front-side surface; growing a first epitaxial layer of un-doped semiconductor material in the trench until the depth equals the target depth TD and the width equals the critical dimension CD; and growing a second epitaxial layer of doped semiconductor material until the trench is filled and the second layer forms a protrusion above a front-side surface of the substrate.

DETAILED DESCRIPTION OF THE EMBODIMENTS

Figure 3A:
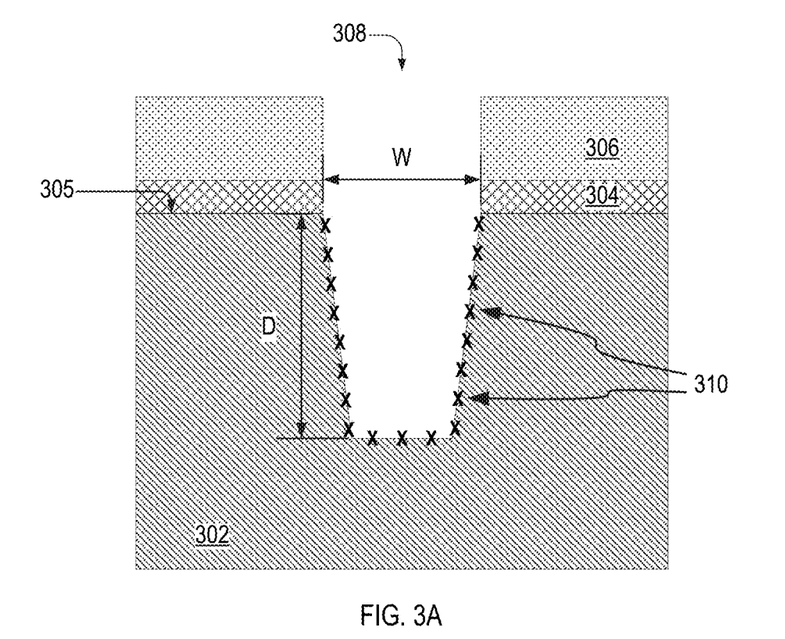
FIG. 3A is a cross-sectional view of a trench etched in a semiconductor substrate, according to an embodiment.
Figure 3B:
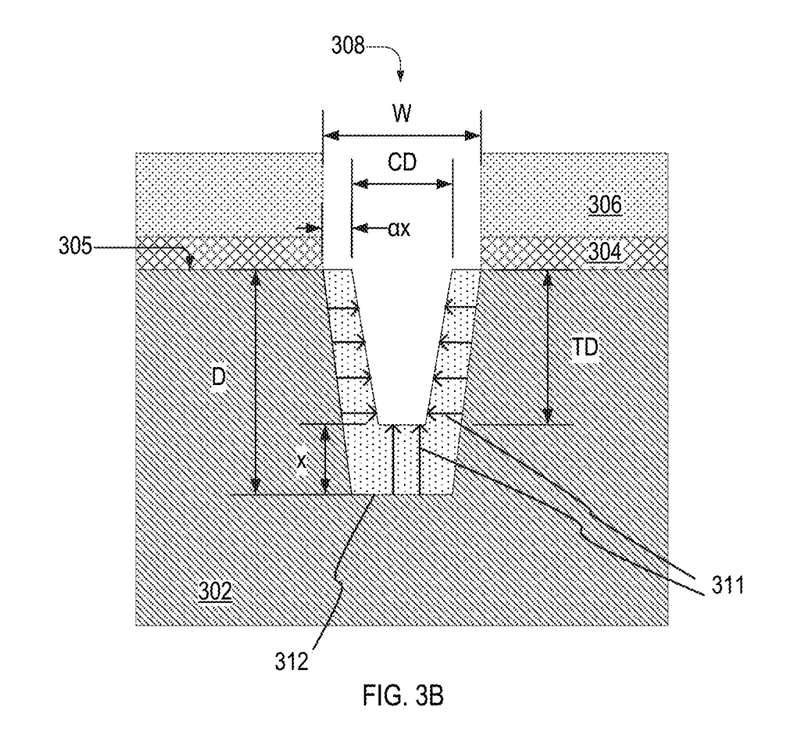
FIG. 3B is a cross-sectional view of the STI of FIG. 3A at a subsequent step in fabrication, according to an embodiment.
Figure 3C:
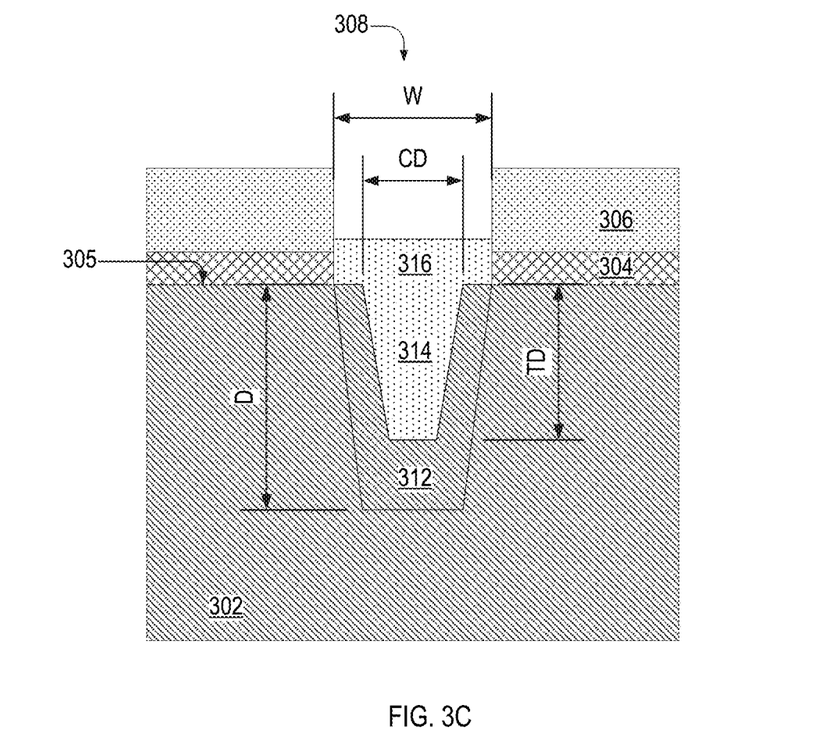
FIG. 3C is a cross-sectional view of an STI structure, according to an embodiment.

In embodiments, target shallow trench isolation (STI) structures having a width, typically referred to as a critical dimension (CD) and a target depth (TD) may be formed in a wafer substrate. STI formation in the wafer substrate is performed prior to fabrication of photodiodes, transistors and other devices in the substrate. The CD of STI structures significantly impacts the density of pixels and therefore, the performance of the image sensor. FIGS. 3A-3C depict several stages in the formation of an STI structure according to embodiments. FIGS. 3A-3C are best viewed together in the following description.

FIG. 3A is cross-sectional view of a substrate 302, a pad oxide layer 304 and a pad nitride layer 306. In an embodiment, substrate 302 is formed from silicon, although other semiconductor materials may be used, for example, bulk substrate silicon substrates doped with n-type or p-type dopants, silicon on insulation (SOI) substrate, silicon germanium, etc. Pad oxide layer 304 may be formed by a process of thermal oxidation to form a thin oxide layer on a planar surface 305 (e.g., front side surface) of substrate 302. In one example, pad nitride layer 306 may be formed on pad oxide layer 304 by depositing silicon nitride material on pad oxide layer 304 using a deposition process such as chemical vapor deposition or physical vapor deposition process, for example. Pad nitride layer 306 is used for a photolithographic process of patterning a surface of substrate 302 in preparation for etching trench 308.

Trench 308 is patterned and etched through layers 304 and 306 and into substrate 302 by a process of isotropic dry etching, for example, plasma etching. In embodiments, isotropic dry etching parameters depend on the material of substrate 302 and include pressure, gas composition (e.g., oxygen $O_2$, fluorine, $SF_6$, $CF_4$, $CHF_3$, $C_4F_8$), gas generation or injection method, and generator power. When removing material from trench 308, the etching process leaves silicon (Si) dangling bonds 310 on the sidewalls and bottom of the trench. For clarity of illustration, not all Si dangling bonds are labeled with a reference numeral in FIG. 3A.

In an embodiment, trench 308 is etched to a depth D deeper into substrate 302 than a target depth (TD) of a target STI structure, and to a width W wider than a critical dimension (CD) of the target STI structure, as further discussed with reference to FIG. 3B. In an embodiment, depth D refers to the depth or distance into the substrate 302 from planar surface 305 of substrate 302. Planar surface 305 may be a front side surface of substrate 302 or a substrate top surface of substrate 302. After etching, trench 308 may be subjected to surface treatment processes to remove some Si defects and reduce humidity at the trench surface, for example, Siconi™ and hydrogen bake. Siconi is a soft dry chemical etching process (e.g. plasma) that may selectively remove oxidized silicon surface defects by exposing the region to be etched to etching agents such as $H_2$, $HF_3$ and $NH_3$. Hydrogen bake is the subsequent surface clearing process used to remove oxide present on the silicon interface. These processes, however, do not remove all Si dangling bonds created by etching.

FIG. 3B is a cross-sectional view of substrate 302 after an epitaxial growth process in an embodiment. Depth D and width W of trench 308 have been reduced by epitaxial growth area 312. The same semiconductor material as substrate 302 is grown on the sidewalls and bottom of trench 308 inside area 312 as shown by arrows 311. Generally, epitaxy is a process of forming new layers on a substrate that have a crystalline structure aligned with that of the substrate as opposed to other techniques that result in a random crystal orientation. In embodiments, a vapor-phase epitaxial growth process using, for example, $BH_3$ (borane) and $SiH_4$ (silane), is performed at a temperature of approximately 700 to 750° C. Although a representative example is given, any suitable epitaxial growth process may be used.

Parameters of an epitaxial growth process such as length of time, growth rate and temperature are chosen to grow substrate material on the bottom and sides inside trench 308 such that the trench is reduced to the CD (target trench width) and target depth TD of a target STI structure. In an embodiment, the depth D of trench 308 is reduced by an amount x=D−TD. In an embodiment, the depth of trench 308 is reduced by an amount x that is approximately 50 to 500 angstroms by the epitaxial growth process. Because of the geometry of trench 308, sidewall growth rate is approximately 25-35% of the growth rate of the bottom of the trench. In an embodiment, each sidewall experiences epitaxial growth such that $$\frac{W - CD}{2} \cong \alpha x$$

where coefficient α is between approximately 0.25 and 0.35. In an embodiment, the sidewall growth is approximately 15 to 150 angstroms.

Because substrate material is epitaxially grown on the sidewall and bottom surfaces of trench 308, Si dangling bonds on the sidewall and bottom of trench 308 as shown in FIG. 3A are cured. The incorporation of an epitaxial growth step in STI structure fabrication means that the material grown in trench 308 has a crystalline structure aligned with that of substrate 302. However, processing steps typically used to complete an STI structure such as, for example, filling trench 308 with an oxide, may induce thermal stress to the semiconductor substrate as well as build up compressive stress in the trench.

FIG. 3C is a cross-sectional view of an STI structure after a second epitaxial growth process. Layer 314 is a doped semiconductor material that has been epitaxially grown in-situ within trench 308 for a length of time necessary to fill trench 308 so that it extends a distance vertically above planar surface 305 of substrate 302 to form a protrusion 316. The extended distance of the protrusion 316 protruded above the planar surface 305 of substrate 302 is non-zero but less than the combined thickness of the pad oxide layer 304 and pad nitride layer 306. Protrusion 316 has a laterally width extended along planar surface 305 within the openings on the pad oxide layer 304 and the pad nitride layer 306 formed during the formation of trench 308, and the laterally width is related to width W of trench 308 and greater than the CD of the STI structure. Protrusion 316 can prevent exposure of corners of the respective STI structure as when any corner of STI trench is exposed, TDDB (time-dependent dielectric breakdown) failure by gate leakage occurred when a gate electrode is formed on substrate 302 affect transistor reliability. In the illustrated example, the width of the protrusion 316 is substantially equal to the width W of trench 308 as epitaxial growth is conformably within the openings of pad oxide layer 304 and pad nitride layer 306.

Layer 314 is configured having a conductive type that is the same as substrate 302's conductive type. For example, for a P-type doped substrate 302, layer 314 is comprised of a P-type doped semiconductor material. The dopant concentration of layer 314 is greater than that of substrate 302. For example, the dopant concentration of substrate 302 may be between approximately $1 \times 10^{10}/cm^2$ and $1 \times 10^{12}/cm^2$, and the dopant concentration of layer 314 may be between approximately $1 \times 10^{13}/cm^2$ and $1 \times 10^{15}/cm^2$. Subsequent processing steps include removal of pad nitride layer 306 and pad oxide layer 304.

Figure 4A:
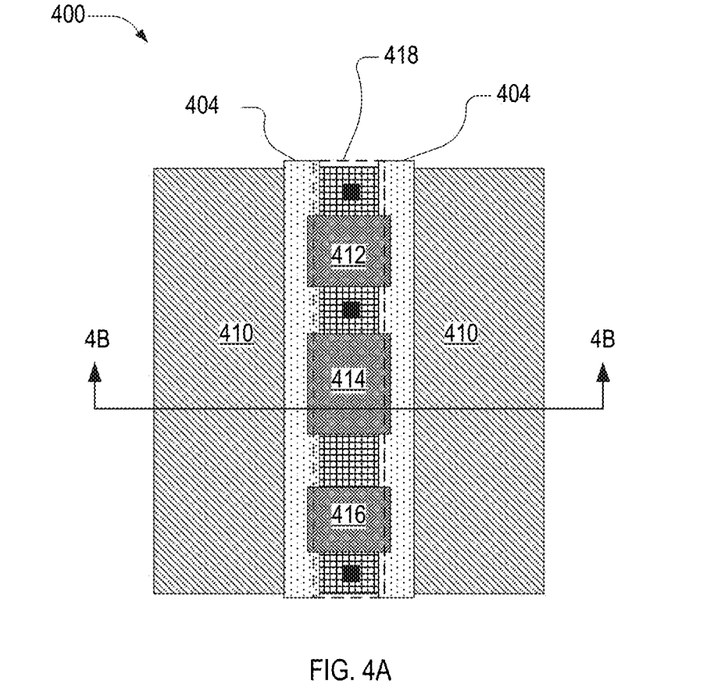
FIG. 4A is a plan view of a pixel in an image sensor, in an embodiment.
Figure 4B:
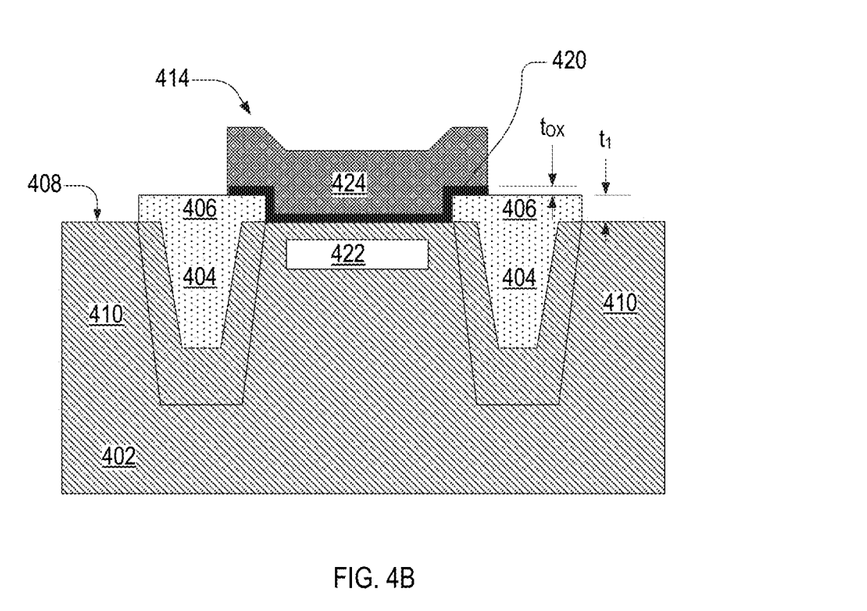
FIG. 4B is a cross-sectional view along line 4B-4B of FIG. 4A.

FIG. 4A is a plan view of a pixel 400 of an image sensor. FIG. 4B is a cross-sectional view along line 4B-4B of FIG. 4A. FIGS. 4A and 4B are best viewed together in the following description. Pixel 400 includes transistors 412, 414 and 416 in P-type region 418 that have been isolated from N-type photodiodes 410 by STI structures 404 formed as described above in connection with FIGS. 3A-3C. STI structures 404 have been formed in substrate 402 and include protrusions 406 that extend above a front-side surface 408 of substrate 402. Protrusions 406 have a thickness $t_1$. A gate oxide layer 420 formed underneath gate electrode 424 has a thickness $t_{OX}$. In an embodiment, gate oxide layer 420 is deposited on front-side surface 408 between STI structures 404. Gate oxide layer 420 overlaps protrusions 406 of STI structures 404 as shown. Gate electrode 424 is formed on gate oxide layer 420. An N-channel source/drain implant region 422 is formed in substrate 402 beneath gate electrode 424. In an embodiment, $t_1 > t_{OX}$ and $t_1$ is between approximately 150 and 300 angstroms to provide a much more graded junction and minimize junction leakage.

Figure 5:
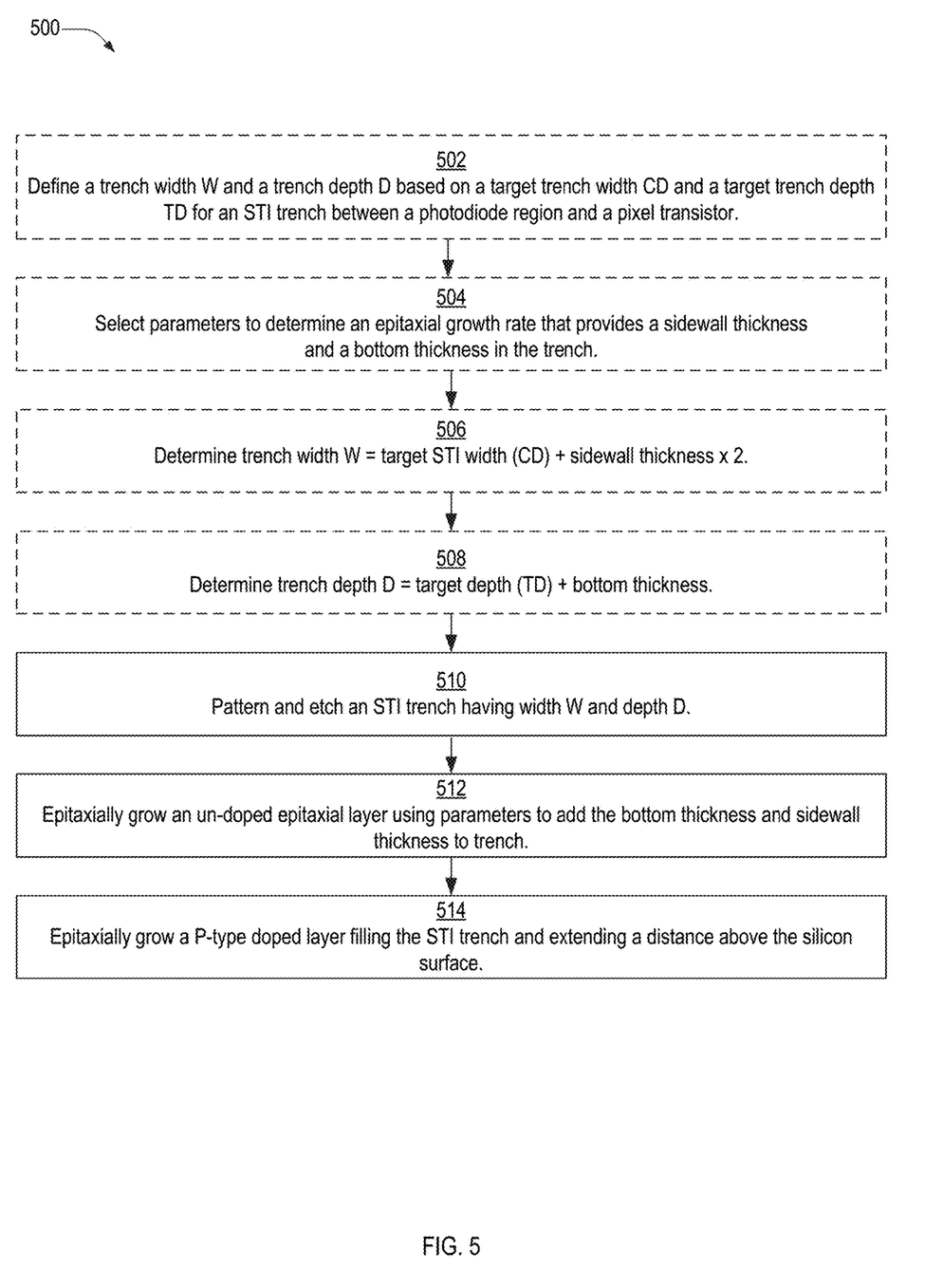
FIG. 5 is a flowchart illustrating a method for fabricating an STI structure in a wafer substrate of an image sensor according to an embodiment.

FIG. 5 is a flowchart illustrating a method 500 for fabricating an STI structure in a wafer substrate of an image sensor. Method 500 includes steps 510, 512 and 514. In embodiments, method 500 also includes at least one of steps 502, 504, 506 and 508.

Step 502 includes defining a trench width W based on a target trench critical dimension (CD) and a trench depth D based on a target depth (TD) of a target STI structure. In an example of step 502, the CD and target depth TD of the target STI structure are selected based on a preferred density of pixels and a preferred performance of an image sensor formed in the substrate. Step 504 includes selecting parameters for an epitaxial growth process. In an example of step 504, the selected parameters will provide a growth in bottom thickness equal to x which is approximately 50 to 500 angstroms and a growth in sidewall thickness within trench 308 of approximately $$\frac{W - CD}{2} \cong \alpha x$$

where coefficient α is between approximately 0.25 to 0.35, as shown in FIG. 3B.

Step 506 includes determining an etching width for trench 308 of FIGS. 3A-3C. In an example of step 506, a width W is determined that is equal to the CD plus two times the sidewall thickness αx, where α is positive and less than or equal to one. In embodiments, coefficient α is between 0.25 and 0.35. Step 508 includes determining a depth D equal to the TD plus a bottom thickness x. In embodiments, steps 504-508 may be performed in any order and/or iteratively.

Step 510 includes patterning and etching trench 308 on a front-side planar surface 305 of the substrate, for example by a lithography and etching process. In an example of step 510, parameters of an etching process are selected to provide a trench 308 having a width W (width of trench opening) and a depth D. Step 512 includes epitaxially growing an un-doped epitaxial layer. In an example of step 512, an epitaxial growth process according to the parameters selected in step 504 forms an un-doped first layer 312 as shown in FIG. 3C. Step 514 includes epitaxially growing a doped layer. In an example of step 514, the second epitaxial growth process forms an in-situ doped second layer 314 of FIG. 3C having a conductive type same as the substrate e.g., P-type, said in-situ doped second layer filling the trench 308 and forming a protrusion 316 above front-side surface 305 as shown in FIG. 3C. Restated, the in-situ doped second layer is arranged to fill the trench 308 and extend a distance above front-side surface planar 305 of substrate 302. Dopants for forming in-situ doped second layer 314 may include boron, gallium, and indium. References to boron herein should be understood to encompass embodiments using gallium or indium.

Figure 6:
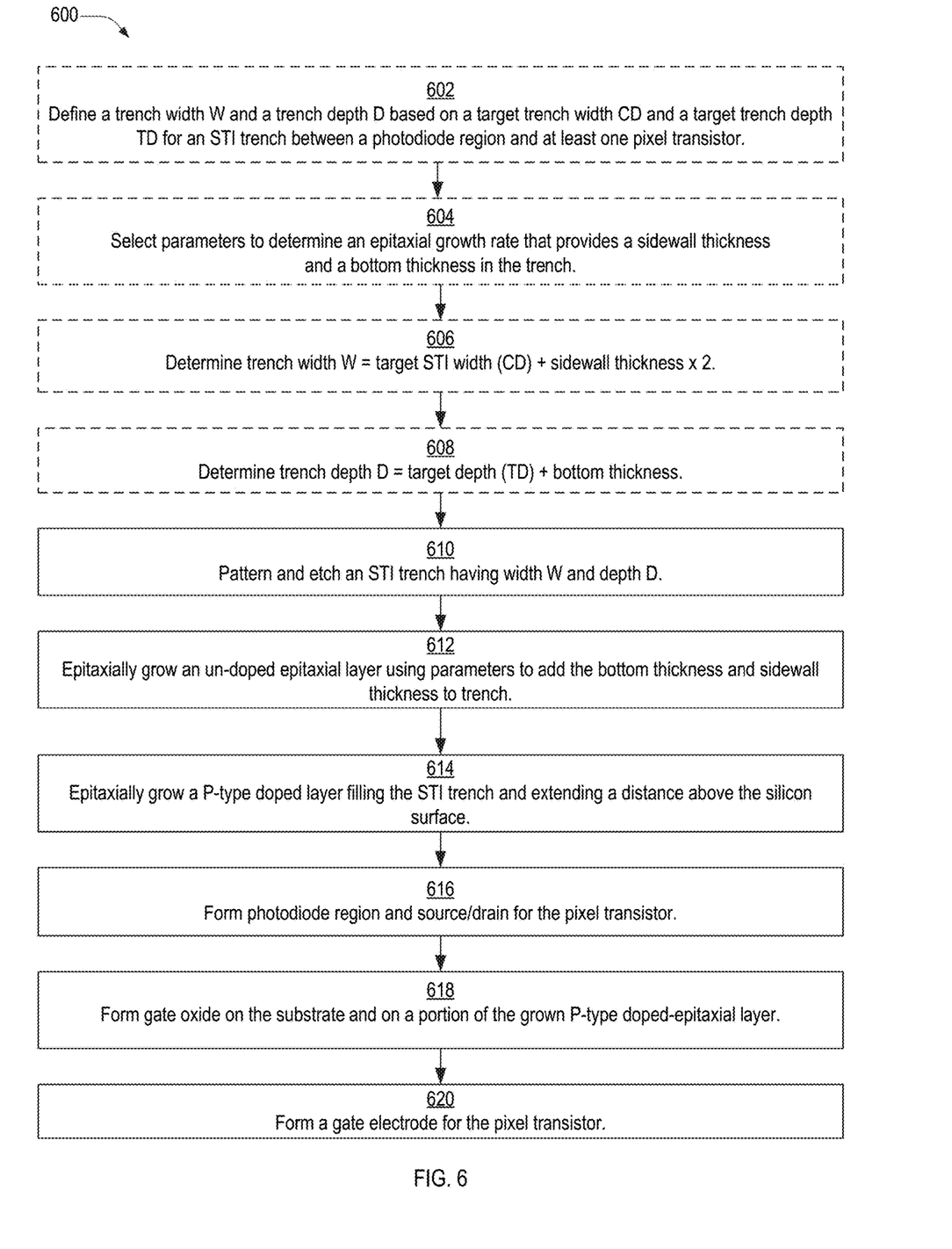
FIG. 6 is a flowchart illustrating a method for fabricating a pixel on a wafer substrate of an image sensor

FIG. 6 is a flowchart illustrating a method 600 for fabricating a pixel on a wafer substrate of an image sensor. Step 602-614 are equivalent to steps 502-514 of FIG. 5. After one or more STI structures have been formed on the wafer substrate e.g., formed on the front side of the wafer substrate, subsequent steps include a fabrication steps 616-620.

Step 616 includes forming a photodiode region and source/drain for a pixel transistor. In an example of step 616, photodiode regions 410 and a source/drain region 422 of FIG. 4 are formed in the wafer substrate, for example by ion implantation, adjacent to STI structures.

Step 618 includes forming a gate oxide layer for a pixel transistor. In an example of step 618, a gate oxide layer 420 is formed on a front-side surface 408 of substrate 402, for example by thermal oxidation or oxide deposition and a portion of adjacent protrusions 406 of adjacent STI structures.

Step 620 includes forming a gate electrode for a pixel transistor. In an example of step 620, a gate electrode of at least a pixel transistor is formed on the gate oxide layer 420. In embodiments, fabrication steps 616-620 are representative and portions of photodiode regions, source drains regions and gate oxide layers may be formed simultaneously or iteratively.

Figure 7:
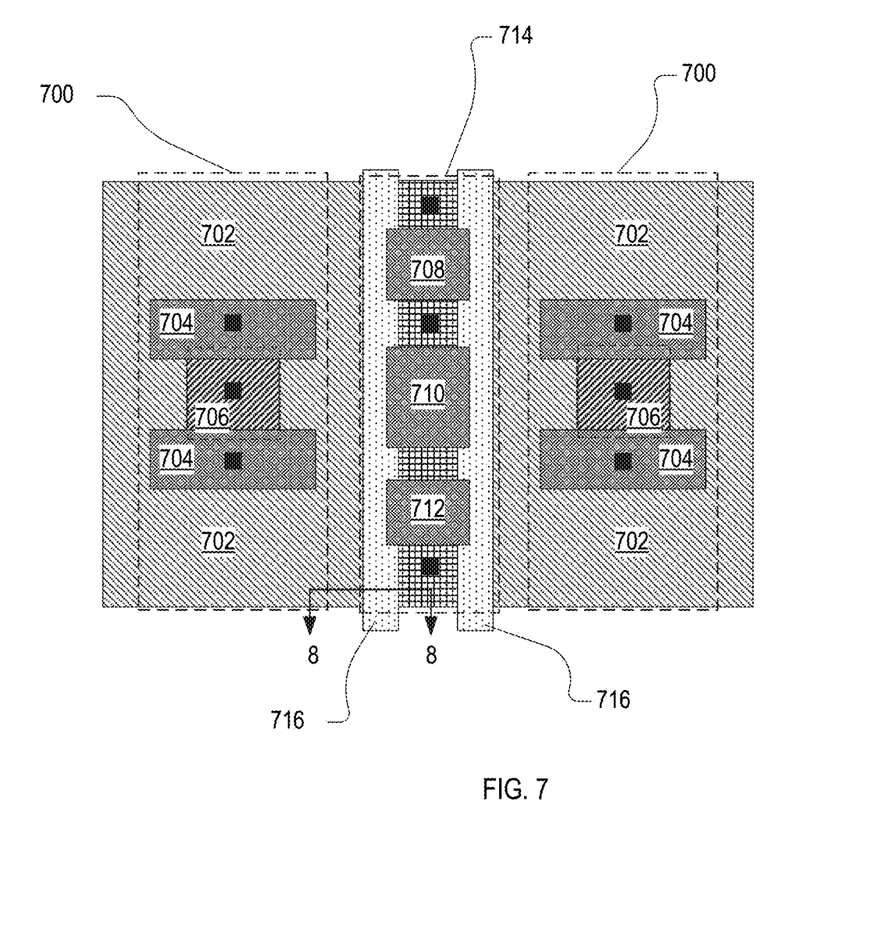
FIG. 7 is a plan view of adjacent pixels in an image sensor, in an embodiment.

FIG. 7 shows a plan view of adjacent pixels in an image sensor. Photodiodes 702, transfer transistors 704 and floating diffusion nodes 706 are formed in photodiode regions 700 (also referred to as active regions or photo-sensing regions) of a wafer substrate. Photodiodes 702 and floating diffusion nodes 706 are doped regions having a first conductive type, e.g. N-type, and the wafer substrate is configured to have a second conductive type opposite to the first conductive type e.g., P-type. In embodiments, each of transfer transistors 704 couple each respective photodiode 702 to the respective floating diffusion node 706, and selectively transfer photo-generated charges from respective photodiode 702 to the respective floating diffusion node 706 in response to transfer signal received the respective transfer gate thereof. Each of photodiodes 702 functions as a source region to the respective transfer transistor 704, and each of floating diffusion node functions as a drain region to transfer transistor 704. Reset transistor 708, source-follower transistor 710 and row select transistor 712 are N-channel transistors formed in pixel transistor region 714 of the wafer substrate. In such example, source and drain regions of the respective reset transistor 708, source-follower transistor 710 and row select transistor 712 are N-type doped region i.e. doped regions of the second conductive type opposite to the first conductive type of the wafer substrate. Photodiodes 702 are isolated from pixel transistor region 714 by boron isolation areas 716 formed of boron-doped shallow trench isolation structure as shown in FIG. 3C and FIG. 4B.

In some embodiments, the junction depths of source and drain regions associated with each respective pixel transistors in pixel transistor region 714 is less or shallower than the target depth (TD) of the individual STI structures formed in boron isolation areas 716 with respect to a front-side surface of the wafer substrate.

For simplicity, two photodiodes per unit pixel are illustrated in FIG. 5. In other embodiments, a pixel may include more or fewer photodiodes. Similarly, the illustrated pixel layout demonstrates a "four-transistor configuration," that is, the pixel transistors for each respective pixel include a transfer transistor, reset transistor, source follower transistor, and row select transistor. In some embodiments, a pixel may be configured to a "three-transistor configuration" and include only a transfer transistor, a reset transistor, and a source follower transistor. In some embodiments, a pixel may be configured to a "five transistor configuration" and include a transfer transistor, a row select transistor, a source follower transistor, a reset transistor (and an overflow transistor or a dual floating diffusion (DFD) transistor. Thus, number of photodiodes in a pixel and the number of pixel transistors used for controlling operation of the pixel may depend on configuration of the respect pixel.

Figure 8:
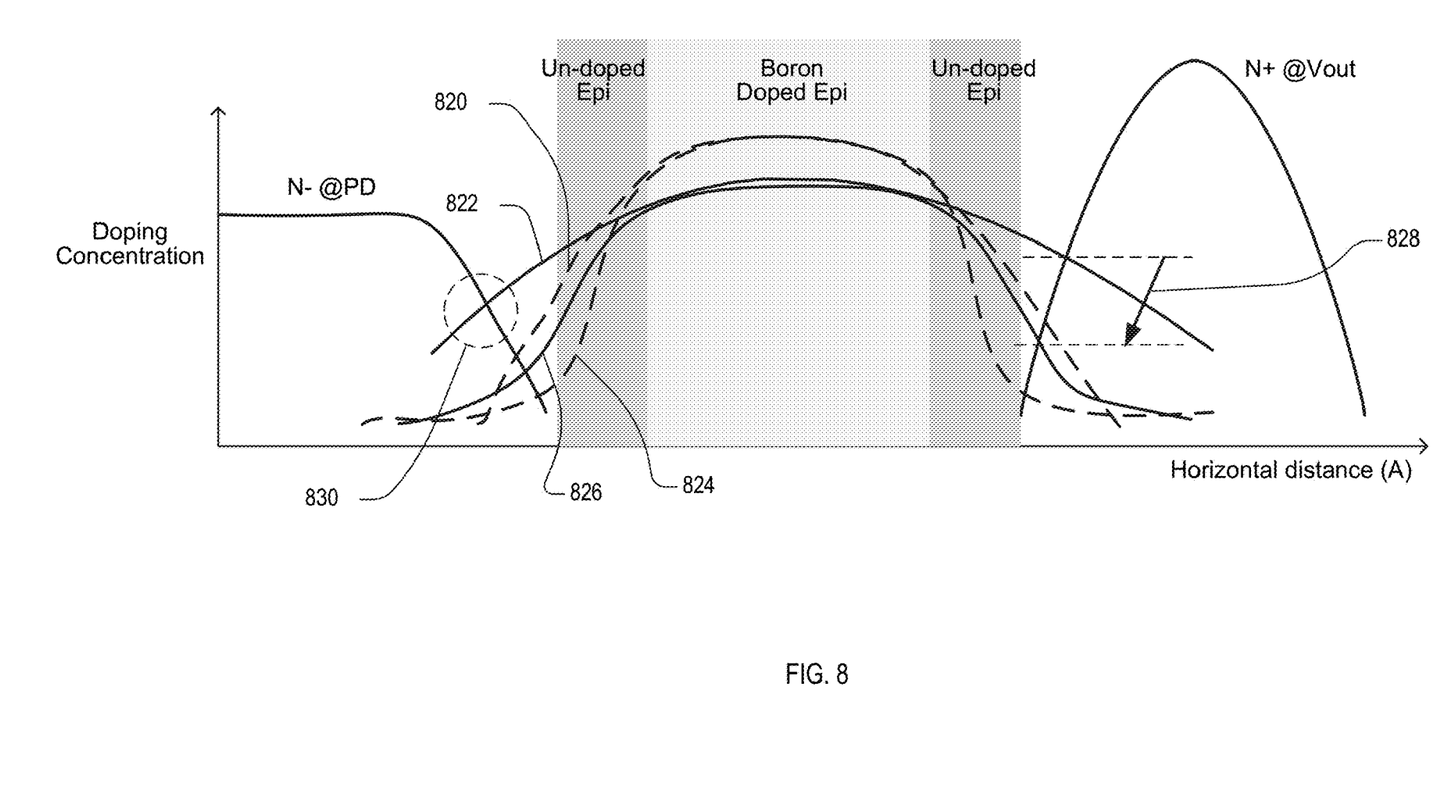
FIG. 8 is a graph of a boron profile comparison as measured across line 8-8 of FIG. 7 at a distance below the surface of the pixels.

FIG. 8 is a graph showing a boron profile comparison between an ion-implant method and the in-situ doped epitaxy layer method of FIGS. 3A-3C and 4B as measured across line 8-8 of FIG. 7 at a distance below the front-side surface 408 of the pixels. Dopant profile 820 shows the boron doping concentration across a horizontal (lateral) distance immediately after ion implant for passivating sidewalls and bottoms of an STI trench, such as trench 308. Dopant profile 822 shows the boron doping concentration after an ion implant process followed by a thermal treatment e.g., annealing process. Dopant profile 824 shows the boron doping concentration across a horizontal (lateral) distance after the epitaxial growth process is applied to shallow trench isolation structures of FIGS. 3C and 4B described above. Dopant profile 826 shows the boron doping concentration of dopant profile 824 after a thermal treatment e.g., an annealing process, of active boron dopant in the doped semiconductor material filled shallow trench isolation. A comparison of dopant profiles 820, 822, 824 and 826 shows that an epitaxial growth process with boron-doping of dopant profiles 824 and 826 provides a much more uniform distribution than that of an ion-implant method of dopant profiles 820 and 822. Further, the epitaxial growth process has a doping profile that is almost flat (very uniform) across the thickness, while the ion-implant is much less sharp, even immediately after implantation as shown in dopant profile 820. Even after diffusion by thermal budget as shown in dopant profiles 822 and 826, the boron profile of dopant profiles 826 is much sharper than that of dopant profile 822 as indicated at 828. This is due to the un-doped epitaxially grown buffer layer 312 of FIG. 3C, so dopant profile 826 will have less of a diffusion impact on the full well capacity of adjacent photodiodes in comparison to dopant profile 822. As indicated at 830, lateral diffusion in the ion-implant method causes loss in full well capacity.

In an embodiment, methods 500 and 600 together with STI structure 318 described above provide an additional benefit with regard to forming trenches on a substrate using a pad nitride as a mask. Photolithography processes have a lower effective limit in the size of areas that can be effectively masked. This also limits the critical dimension (e.g., target trench width) that can be achieved for a target STI structure. In embodiments, a target STI structure even smaller than the lower photolithography patterning limitation may be formed by etching a trench at the patterning limitation, then epitaxially growing additional substrate material in the trench. This further reduces the space of STI (spacer between photodiode region and pixel transistor region) and increases an area on the substrate for photodiodes, thus larger size of pixel array can be formed achieving higher imaging resolution.

Methods 500 and 600 also provide a shallow trench isolation structure that is free of Si dangling bonds on the bottom and sidewalls of a trench created by plasma etching because silicon is grown epitaxially on these surfaces, curing the Si dangling bonds. In embodiments, any type of substrate may be used, including doped silicon, as doped silicon may also be epitaxially grown to match the substrate. This provides a doped substrate without silicon-surface damage caused by boron implant doping.

The two-step epitaxial growth process described herein enables much higher boron isolation resolution with much more abrupt boron profile as shown in FIG. 8. Further, the STI structure provides a much more graded junction to N+ and prevents damage to the substrate that may be caused by an ion-implant process.

Combinations of Features

Features described above as well as those claimed below may be combined in various ways without departing from the scope hereof. The following enumerated examples illustrate some possible, non-limiting combinations:

(A1) A CMOS image sensor includes a semiconductor substrate having a photodiode region and a pixel transistor region separated by a shallow trench isolation (STI) structure, said substrate having a front-side surface forming a trench extending into the semiconductor substrate and having a trench depth D relative to a planar region of the front-side surface and a trench width W at the front-side surface; a first layer of un-doped semiconductor material epitaxially grown in the trench to provide an STI structure having a target depth TD less than D and a critical dimension CD less than W; a second layer of doped semiconductor material epitaxially grown on the first layer, said second layer filling the trench and forming a protrusion above the front-side surface of the semiconductor substrate; and a gate oxide layer and a gate electrode of the pixel transistor formed on the front-side surface second layer.

(A2) In sensor (A1), the photodiode region may comprise a first conductive type.

(A3) In sensors (A1) or (A2), the semiconductor substrate and the first and second layers may comprise a second conductive type opposite to the first conductive type.

(A4) In any of sensors (A1)-(A3), the second layer may comprise a boron-doped semiconductor material with a dopant concentration greater than the semiconductor substrate.

(A5) In any of sensors (A1)-(A4), wherein the gate oxide layer may be deposited in between the gate electrode and the protrusion, and the protrusion may have a thickness greater than the thickness of the gate oxide layer.

(A6) In sensor (A5), the thickness may be between approximately 150 and 300 angstroms.

(A7) Any of sensors (A1)-(A5) may also include a plurality of STI structures, a plurality of photodiode regions and a plurality of transistors.

(B1) A shallow trench isolation (STI) structure having a target depth TD and a critical dimension CD includes a semiconductor substrate having a substrate front-side surface forming a trench extending into the semiconductor substrate and having a trench depth D relative to a planar region of the substrate front-side surface surrounding the trench such that D is greater than TD and a trench width W at the substrate front-side surface such that W is greater than CD; a first layer of un-doped semiconductor material epitaxially grown in the trench to provide an STI structure having a target depth TD and a critical dimension CD; and a second layer of doped semiconductor material epitaxially grown on the first layer, said second layer filling the trench and forming a protrusion above the front-side surface of the semiconductor substrate.

(B2) In structure (B1), D−TD may be between approximately 50 and 500 angstroms.

(B3) In any of structures (B1)-(B2), (W−CD)/2 may be between approximately 15 and 150 angstroms.

(B4) In any of structures (B1)-(B3), the semiconductor substrate and the first and second layers may comprise silicon.

(B5) In any of structures (B1)-(B4), the semiconductor substrate and the first and second layers may comprise a same conductive type.

(B6) In any of structures (B1)-(B5), the second layer may comprise a boron-doped semiconductor material with a dopant concentration greater than the semiconductor substrate.

(C1) A method of forming a target shallow trench isolation (STI) structure in a semiconductor substrate, including patterning and etching a trench having a bottom and sidewalls in the semiconductor substrate, said trench having a depth (D) deeper than a target depth (TD) of the target STI structure relative to a planar region of a front-side surface of the semiconductor surface and a width (W) wider than a critical dimension (CD) of the target STI structure at the front-side surface; growing a first epitaxial layer of un-doped semiconductor material in the trench until the depth equals the target depth TD and the width equals the critical dimension CD; and growing a second epitaxial layer of doped semiconductor material until the trench is filled extended above a front-side surface of the semiconductor substrate.

(C2) In the method of (C1), wherein growing the second epitaxial layer of doped semiconductor material may further comprises growing the second epitaxial layer of doped semiconductor material until the second layer forms a protrusion above the front-side surface of the semiconductor substrate.

(C3) In methods (C2), wherein the protrusion may have a thickness of between approximately 150 and 300 angstroms.

(C4) In any of methods (C1)-(C3), may include forming a transistor in the front-side surface of the semiconductor substrate adjacent to the target STI structure.

(C5) The method of (C4), may include forming a gate oxide layer and gate electrode of the transistor on a portion of the protrusion of the second layer.

(C6) In any of methods (C1)-(C5), the first and second layers may be epitaxially grown at a temperature between approximately 700 and 750° C.

(C7) In any of methods (C1)-(C6), wherein D−TD may be between approximately 50 and 500 angstroms.

(C8) In any of methods (C1)-(C7), wherein (W−CD)/2 may be between approximately 15 and 150 angstroms.

(C9) In any of methods (C1)-(C8), wherein the semiconductor substrate and the first and second layers may comprise a second conductive type.

(C10) In any of methods (C1)-(C9), wherein the semiconductor substrate and the first and second layers may comprise silicon.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated: (a) the adjective "exemplary" means serving as an example, instance, or illustration, and (b) the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A CMOS image sensor comprising:
   a semiconductor substrate having a photodiode region and a pixel transistor region separated by a shallow trench isolation (STI) structure, said semiconductor substrate having a front-side surface forming a trench extending into the semiconductor substrate and having a trench depth D relative to a planar region of the front-side surface and a trench width W at the front-side surface of the semiconductor substrate;
   a first layer of un-doped semiconductor material epitaxially grown in the trench to provide an STI structure having a target depth TD less than D and a critical dimension CD less than W;
   a second layer of doped semiconductor material epitaxially grown on the first layer, said second layer filling the trench and forming a protrusion above the front-side surface of the semiconductor substrate; and
   a gate oxide layer and a gate electrode of a pixel transistor formed on the front-side surface of the pixel transistor region.

2. The CMOS image sensor of claim 1, wherein the photodiode region comprises a first conductive type.

3. The CMOS image sensor of claim 2, wherein the semiconductor substrate and the second layer comprise a second conductive type opposite to the first conductive type.

4. The CMOS image sensor of claim 1, wherein the second layer comprises a boron-doped semiconductor material with a dopant concentration greater than a dopant concentration of the semiconductor substrate.

5. The CMOS image sensor of claim 1, wherein the gate oxide layer is deposited in between the gate electrode and the protrusion, and the protrusion has a thickness greater than the thickness of the gate oxide layer.

6. The CMOS image sensor of claim 5, wherein the thickness is between approximately 150 and 300 angstroms.

7. A shallow trench isolation (STI) structure having a target depth TD and a critical dimension CD comprising: a semiconductor substrate having a substrate front-side surface forming a trench extending into the semiconductor substrate and having a trench depth D relative to a planar region of the substrate front-side surface surrounding the trench such that D is greater than TD and a trench width W at the substrate front-side surface such that W is greater than CD; a first layer of un-doped semiconductor material epitaxially grown in the trench to provide an STI structure having the target depth TD and the critical dimension CD; and a second layer of doped semiconductor material epitaxially grown on the first layer, said second layer filling the trench and forming a protrusion above the substrate front-side surface of the semiconductor substrate; wherein the STI structure separates a photodiode region and a pixel transistor region disposed in the semiconductor substrate.

8. The STI structure of claim 7, wherein D−TD is between approximately 50 and 500 angstroms.

9. The STI structure of claim 7, wherein (W−CD)/2 is between approximately 15 and 150 angstroms.

10. The STI structure of claim 7, wherein the semiconductor substrate, the first and the second layers comprise silicon.

11. The STI structure of claim 7, wherein the semiconductor substrates and the second layer comprise of same conductive type.

12. The STI structure of claim 7, wherein the second layer comprises a boron-doped semiconductor material with a dopant concentration greater than a dopant concentration of the semiconductor substrate.

13. A method of forming a target shallow trench isolation (STI) structure separating a photodiode region and a pixel transistor region in a semiconductor substrate, comprising: etching a trench having a bottom and sidewalls in the semiconductor substrate, said trench having a depth (D) deeper than a target depth (TD) of the target STI structure relative to a planar region of a front-side surface of the semiconductor substrate and a width (W) wider than a critical dimension (CD) of the target STI structure at the front-side surface; growing a first epitaxial layer of un-doped semiconductor material in the trench until the depth equals the target depth TD and the width equals the critical dimension CD; and growing a second epitaxial layer of doped semiconductor material until the trench is filled and extended above the front-side surface of the semiconductor substrate.

14. The method of claim 13, wherein growing the second epitaxial layer of doped semiconductor material further comprises growing the second epitaxial layer of doped semiconductor material until the second layer forms a protrusion above the front-side surface of the semiconductor substrate.

15. The method of claim 14, wherein the protrusion has a thickness of between approximately 150 and 300 angstroms.

16. The method of claim 14, further comprising forming a transistor in the front-side surface of the semiconductor substrate adjacent to the target STI structure.

17. The method of claim 16, further comprising forming a gate oxide layer and gate electrode of the transistor on a portion of the protrusion of the second layer.

18. The method of claim 13, wherein the first and second layers are epitaxially grown at a temperature between approximately 700 and 750° C.

19. The method of claim 13, wherein the semiconductor substrate, the first and second layers comprise silicon.

* * * * *